United States Patent [19]
Nelson

[11] 3,939,432
[45] Feb. 17, 1976

[54] FM LIMITER WITH INPUT LEVEL SENSING AND TTL LEVEL OUTPUT

[75] Inventor: Larry Allan Nelson, Hillsboro, Oreg.
[73] Assignee: Tektronix, Inc., Beaverton, Oreg.
[22] Filed: Mar. 18, 1974
[21] Appl. No.: 452,298

Related U.S. Application Data
[63] Continuation-in-part of Ser. No. 360,519, May 15, 1973, Pat. No. 3,863,264.

[52] U.S. Cl. ............ 328/13; 307/235 E; 307/235 T; 307/261; 328/28; 328/150; 329/110
[51] Int. Cl.² ...................... H03B 19/00; H03K 5/00
[58] Field of Search .......... 307/229, 261, 268, 235; 328/13, 28, 31, 116, 117, 150; 329/102–104, 110, 122, 145

[56] References Cited
UNITED STATES PATENTS

| | | | |
|---|---|---|---|
| 3,278,851 | 10/1966 | Damon, Jr. et al. | 329/102 |
| 3,456,201 | 7/1969 | Zrubek | 328/116 |
| 3,659,208 | 4/1972 | Fussell | 328/31 |
| 3,668,532 | 6/1972 | Potash | 328/116 |
| 3,760,282 | 9/1973 | Arnold et al. | 328/117 |
| 3,764,927 | 10/1973 | Allinger et al. | 329/104 |

*Primary Examiner*—Stanley D. Miller, Jr.
*Attorney, Agent, or Firm*—Adrian J. La Rue

[57] ABSTRACT

A system for limiting an FM signal to produce outputs which are TTL compatible, yet retain the zero crossings of the incoming FM signal as long as the amplitude of that signal remains above a chosen minimum and the frequency remains less than a chosen amount.

2 Claims, 6 Drawing Figures

FM LIMITER WITH INPUT LEVEL SENSING AND TTL LEVEL OUTPUT

CROSS-REFERENCE TO RELATED APPLICATION

This application is a continuation-in-part of U.S. patent application Ser. No. 360,519 filed May 15, 1973, now U.S. Pat. No. 3,863,264.

BACKGROUND OF THE INVENTION

In Sequence Color and Memory Television Systems, hereinafter referred to as SECAM, the transmitted color subcarrier alternates between two color difference signals from line to line. For this reason SECAM color difference signals, $D'_B$ and $D'_R$, alternately modulate the subcarrier. As a result of this frequency modulation, the color signal is less sensitive to differential phase and differential gain. However, since only one color difference signal is transmitted at one particular time, some memory device must be used so that such color difference signals are available simultaneously, say, in the receiver or image producing device such as a color picture tube. Herein then, lies a disadvantage of the prior art, namely non-ideal delay line.

As is well-known, the last color information to enter the SECAM delay line prior to the viewed line was the opposite color difference signal, any reflections due to such non-ideal delay line termination or construction will appear as cross colors at the output of the delay line. This cross color may be present from multiple reflections, with its amplitude reflecting the amount of time it has been present in the delay line. Some direct transmission through the delay line may also be present, but this is principally a property of the delay line construction. Such cross color represents a deterioration of a theoretical advantage over other systems of color television transmission which is basic to SECAM.

A second disadvantage is that in steering the alternating lines of color information from the output of the delay line and direct transmission to the input of the $D'_R$ and $D'_B$ demodulators, some cross talk must occur in the switch. Where the signals transmitted are analog, this represents a noticeable degradation of the chrominance signals.

Following the adding together of the previously mentioned color difference signals, such signals must be amplitude limited and frequency detected due to frequency modulation as discussed. The frequency detector, or modulator as hereinafter referred, produces an output dependent upon how much an input signal differs in frequency from an undiviated or rest frequency. In other words, amplitude variations of the color difference signals are derived in response to frequency variations. Thus, another disadvantage of the prior art.

As is well-known by those skilled in the art, many means of demodulation of a frequency modulated signal are known, one of which is the phase lock loop. In SECAM color systems large frequency deviations of the color subcarrier occur at a very fast rate. Because of this, it is very difficult to build a phase lock loop demodulator. Inherent in the construction of such demodulator is high loop gain and large loop bandwidth which tend to decrease the advantage of a phase lock loop demodulator over known methods of frequency detection.

In an article written by C. J. Byrne entitled "Properties and Design of the Phase Controlled Oscillator with a Sawtooth Comparator" and published in the Bell System Technical Journal, March 1962, means including a sawtooth phase comparator are discussed to overcome the disadvantages of the more common sinusoidal phase comparators and thereby construct a phase locked loop which would be improved in some respects over phase locked loops mentioned above. Such improvement, if carried further, could be used to make a more improved phase lock loop demodulator for a SECAM color system.

The disadvantages of the prior art were overcome by the invention described in U.S. Pat. No. 3,863,264 in that the color difference signals are digitized at the incoming subcarrier level prior to being applied to the delay line. Digitizing of such signals eliminates the effect of cross talk within the switch. Further, routing of the color difference signals through multiple delay lines reduce reflections below any desired level. These two advantages combine to provide virtually no cross color, a theoretical advantage of the SECAM system. A further advantage is that the digitizing of the color difference signals at the incoming subcarrier level provides better equivalent noise bandwidth because of the digital phase detector which enables a lower bandwidth phase lock loop to be used.

The invention described in U.S. Pat. No. 3,863,264 further overcame the disadvantage of the prior art in that any switching before or after the delay line(s) can consist of simple logic gates. Also, by using digital signals corresponding to the color difference signal subcarrier and decoding such signals based upon both a positive and a negative transition, a very appreciable increase in decoder accuracy, speed, and equivalent noise bandwidth can be obtained.

As is well known, the trigger points of the Schmitt trigger used for the waveform squaring circuit described in U.S. Pat. No. 3,863,264 must be chosen at a sufficiently high level to ensure enough delay between the modulator-demodulator transition and the Schmitt trigger transistion to obtain a clock pulse of usable width. To produce a usable width clock pulse for the highest level input signal which can be expected, the trip points of the Schmitt trigger must be selected at an amplitude, say 10 percent of the expected input peak value. This sets the lowest level input signal for which the waveform squaring circuit will produce an output. A disadvantage, however, is that frequently the level selected is not low enough for reasonable fluctuations in input signal level.

BRIEF SUMMARY OF INVENTION

The present invention overcomes the disadvantage of the waveform squaring circuit by providing an improved circuit that operates with very high level input signals and low level input signals selected independently. It provides for limiting an FM signal to produce outputs which are TTL compatible, yet retain the zero crossings of the incoming FM signal as long as the amplitude of that signal remains above a chosen minimum and the frequency remains less than a chosen amount.

It is therefore an object of the present invention to provide an improved FM limiter with input level sensing and TTL level output.

It is still another object of the present invention to provide an improved FM limiter with input level sensing and TTL level output whereby color difference subcarrier signals are digitized.

It is still yet another object of the present invention to provide an improved FM limiter with input level sensing and TTL level output having a substantial dynamic range.

The subject matter of the present invention is particularly pointed out and distinctly claimed in the concluding portion of this specification. The invention, however, both as to organization and method of operation together with further advantages and objects thereof, may best be understood by reference to the following description taken in connection with the accompanying drawings wherein like reference characters refer to like elements. It is to be understood, however, that these embodiments are not intending to be exhausting nor limiting of the invention but are given for purposes of illustration in order that others skilled in the art may fully understand the invention and principles thereof and the manner of applying it in particular use so that they may modify it in various forms, each as may best be suited to the conditions of the particular use.

IN THE DRAWINGS

FIG. 1 is a block diagram of a conventional SECAM decoder;

FIG. 2 is a block diagram of a SECAM decoder according to U.S. Pat. No. 3,863,264

DETAILED DESCRIPTION OF INVENTION

Figure 1:
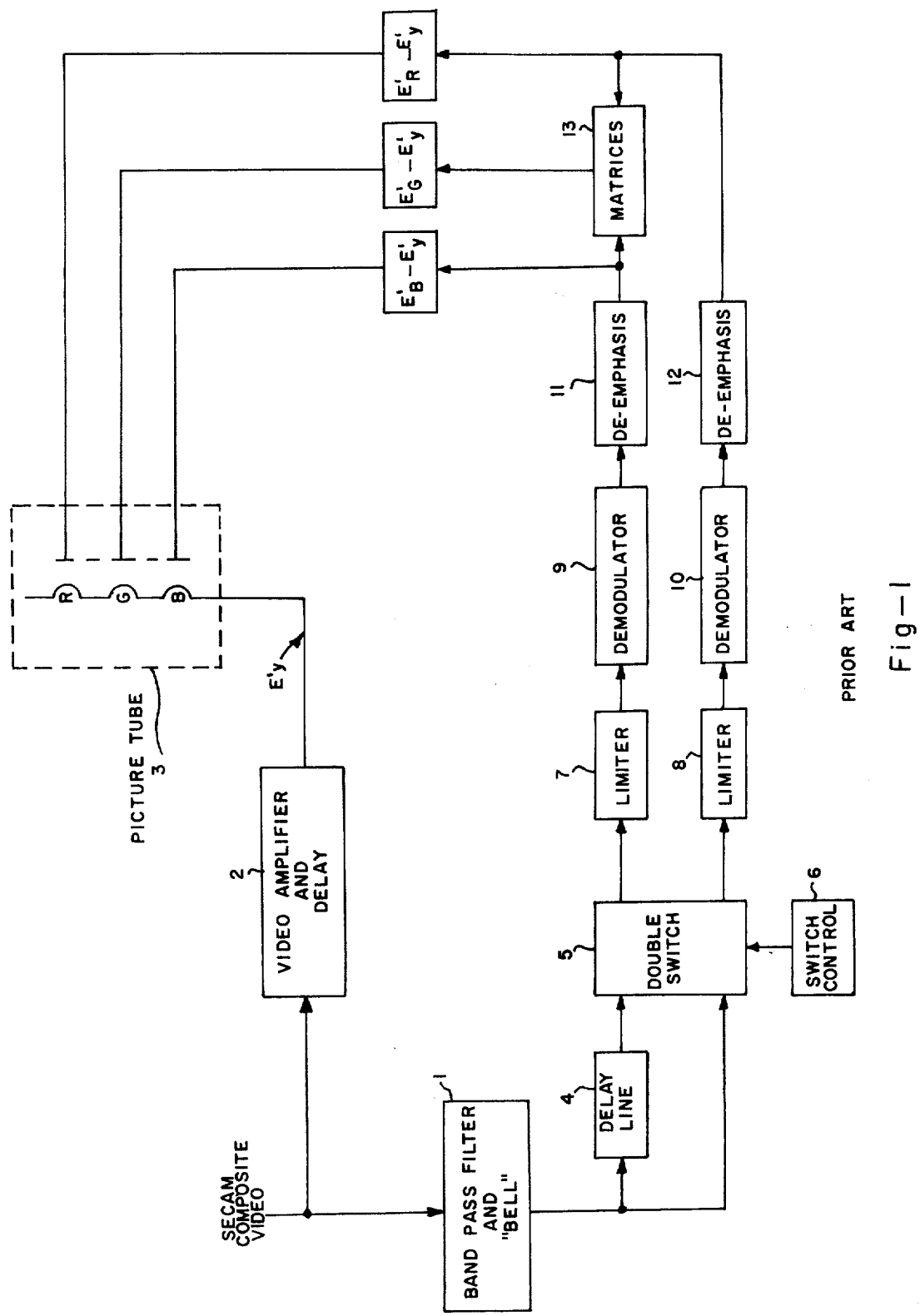

FIG. 1 shows a block diagram of a conventional SECAM decoder. Composite video, consisting of a luminance signal portion, a chrominance signal subcarrier portion, and a synchronization signal portion, all of which are added together in a conventional manner, is applied to a Band Pass Filter and "Bell" stage 1 and a video amplifier and delay stage 2. In a conventional matter, the luminance and synchronization portions of the composite video signal are separated from the chrominance portion of the composite video signal. The luminance and synchronization signals are passed through the video amplifier and delay stage 2 which separates the synchronization information from the luminance, delays the luminance, then applies it to a picture tube 3. Although not shown, the synchronization portion of the signal is used to synchronize the deflection and timing circuits as is well-known.

The chrominance portion of the signal is then applied to a Bell having characteristics opposite to the Bell of the encoder. Thus, the chrominance signal has its modulated subcarrier re-established to the correct amplitude. As is well-known, the chrominance portion of the composite video signal leaving the band pass filter and bell stage 1 consists of two color difference signals corresponding to the color red minus luminance and the color blue minus luminance, hereinafter referred to as $D'_R$ and $D'_B$. As previously mentioned, $D'_R$ and $D'_B$ are transmitted sequential i.e., a line of $D'_R$, where line refers to the time required between synchronization pulses, is transmitted followed by a line of $D'_B$, etc.

The decoder is equipped with a memory 4, hereinafter referred to as Delay Line, to continuously record the color difference signal transmitted, either $D'_R$ or $D'_B$, and repeating the one transmitted the line before. Using this method, two chrominance difference signals, one restored by the delay line 4 and the other directly, are obtained simultaneously. An electronic double switch 5, controlled by a switch control 6, is provided so that in a first position, the direct color difference signal is applied to a first limited 7 and the memorized color difference signal is applied to a second limited 8, and reversing the direction of switching during the next line so that in a second position, the direct color difference signal is applied to the second limiter 8 and the memorized color difference signal is applied to the first limited 7. As can be discerned from the above, the output to either the first limiter 7 or the second limiter 8 will be the two color difference signals simultaneously.

Limiters 7 and 8 are used to limit any amplitude variations in either the $D'_R$ or $D'_B$ signals occuring during the transmitting process. Following limiters 7 and 8, the color difference signals are demodulated by demodulators 9 and 10. In principle, the demodulator supplies an output signal which is proportional to the deviation in the instantaneous frequency of the $D'_R$ and $D'_B$ subcarrier received. As is well-known, the demodulator which may be used is the standard phased locked loop to produce a signal which follows the incoming FM signal with its voltage controlled oscillator. The phase comparator of the phase locked loop is the error detector of the loop and, as usually constructed, produces an output voltage which is proportional to the sine of the phase difference of the voltage controlled oscillator, Vco as hereinafter referred, and the incoming FM signal.

The voltages which drive the Vco corresponding to $D'_R$ and $D'_B$ are applied to de-emphasis stages 11 and 12 having characteristics opposite to the pre-emphasis of the encoder wherein the high frequency components are returned to their original value for reasons well-known. The output of each de-emphasis stage is applied to matrix 13 wherein the combination of $D'_R$ and $D'_B$ produce a third color difference signal $E'_g - E'_y$ i.e., green minus luminance. The three signals, obtained by matricing from the chrominance signals previously described, are applied to the proper electrodes of picture tube 3. Hence, if picture tube 3 is a color picture tube, the currents of the beams caused by luminance $E'_y$ are proportional to the signals red, green, and blue.

Figure 2:
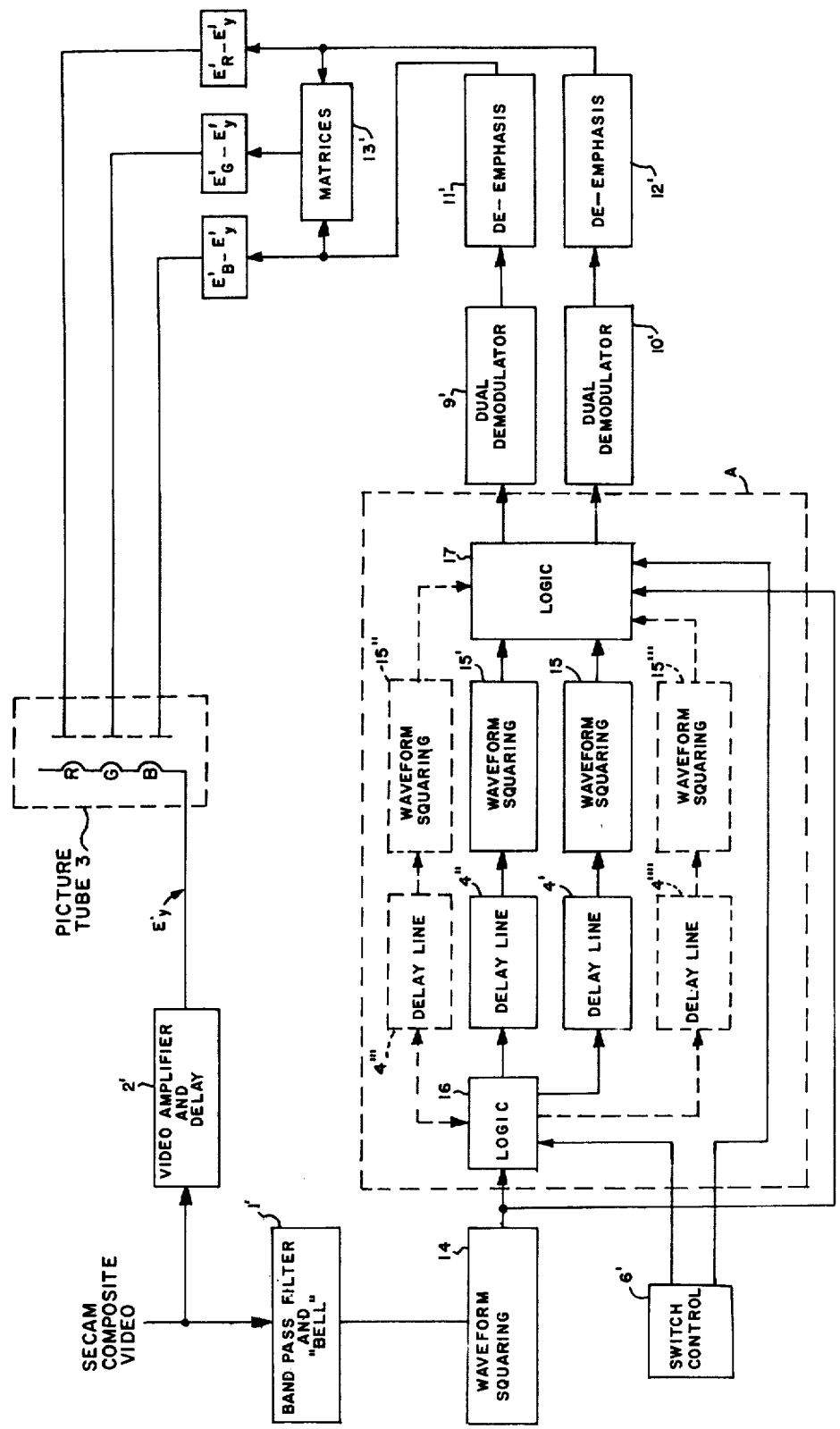

FIG. 2 is a block diagram of the SECAM decoder according to U.S. Pat. No. 3,863,264. As can be seen from this block diagram, a first waveform squaring stage 14 and a plurality of second waveform squaring stages 15, 15', 15'' and 15''' have been added. In addition, first logic stage 16 and second logic stage 17 have been added. Replacing delay line 4 of FIG. 1 is a plurality of delay lines 4', 4'', 4''', and 4''''. It should be noted that at least two delay lines and second waveform squaring stages 4' – 15 and 4'' – 15' respectively must be used, but in no way should the idea of more than two such sets of stages be disregarded. In addition, double switch 5, limiters 7 and 8 and demodulators 9 and 10 of FIG. 1 have been replaced by dual demodulators 9' and 10' respectively.

Basically, the improvement comprises means to convert the frequency modulated color difference signals $D'_R$ and $D'_B$ subcarrier into digital signals. These digital signals are more easily switched and enables the use of a special phase comparator which decreases equivalent noise bandwidth. By using digital signals it is now feasible to completely eliminate any cross talk due to delay lines and switching. Second waveform squaring circuits 15, 15', 15'' and 15''' must be used to convert the signal at the delay line outputs back to a digital signal. This is because the digital signal passing down the delay lines, which in reality is a band pass filter, produces an analog signal. As the present invention uses digital signals, the delayed signal must be reconverted. For simplicity, all the waveform squaring circuits are identical. Logic stages 16 and 17 are required for routing the digital signals into and out of the delay lines in proper sequence. Logic stages 16 and 17 have circuitry therein which is determined by the number of delay line-waveform squaring sets used.

As only digital signals are present, such logic stages can be a simple logic function as is well-known. The output of logic stage 17 routes the signals to the dual demodulators. Finally, dual demodulators 9' and 10' have replaced limiters 7 and 8 and demodulators 9 and 10 respectively. By digitizing and using sawtooth phase detectors, there is no need of separate limiters which were required for best performance of the prior art. Demodulators 9' and 10' have the advantage over conventional demodulators in that its phase detector output is linear for larger values of phase error. However, even though phase errors can be detected very quickly and over a large range of phase errors using the sawtooth phase comparator in the phase locked loop, described by C. J. Byrne and previously discussed, it is limited in that the time required to distinguish a phase error is determined by the time between the input positive leading edges. This is because the flip-flops, operation will be discussed later in the specification, used have their set input controlled by positive leading edges of pulses digitally derived from input signals, originally sinusoids. In the case of SECAM, the deviation of the subcarrier is not a small percentage of the undeviated subcarrier frequency. To adapt this type of phase comparator to use, the present invention uses two such flip-flops. The positive edges are used as before, however, the negative leading edges of the input signal and the negative leading edges of the Vco signal are also used to drive a second flip-flop. This doubles the gain of the phase comparators and reduces time between the input phase change and the output response of the phase comparators so that in effect a sample is taken at each zero crossing of an input signal rather than only the positive zero crossings. Further, the output of the phase detector flip-flops are uniquely combined to enhance the capabilities of the phase locked loop. The output of the dual demodulators are then applied to the remaining stages as discussed previously for the prior art.

Figure 3:
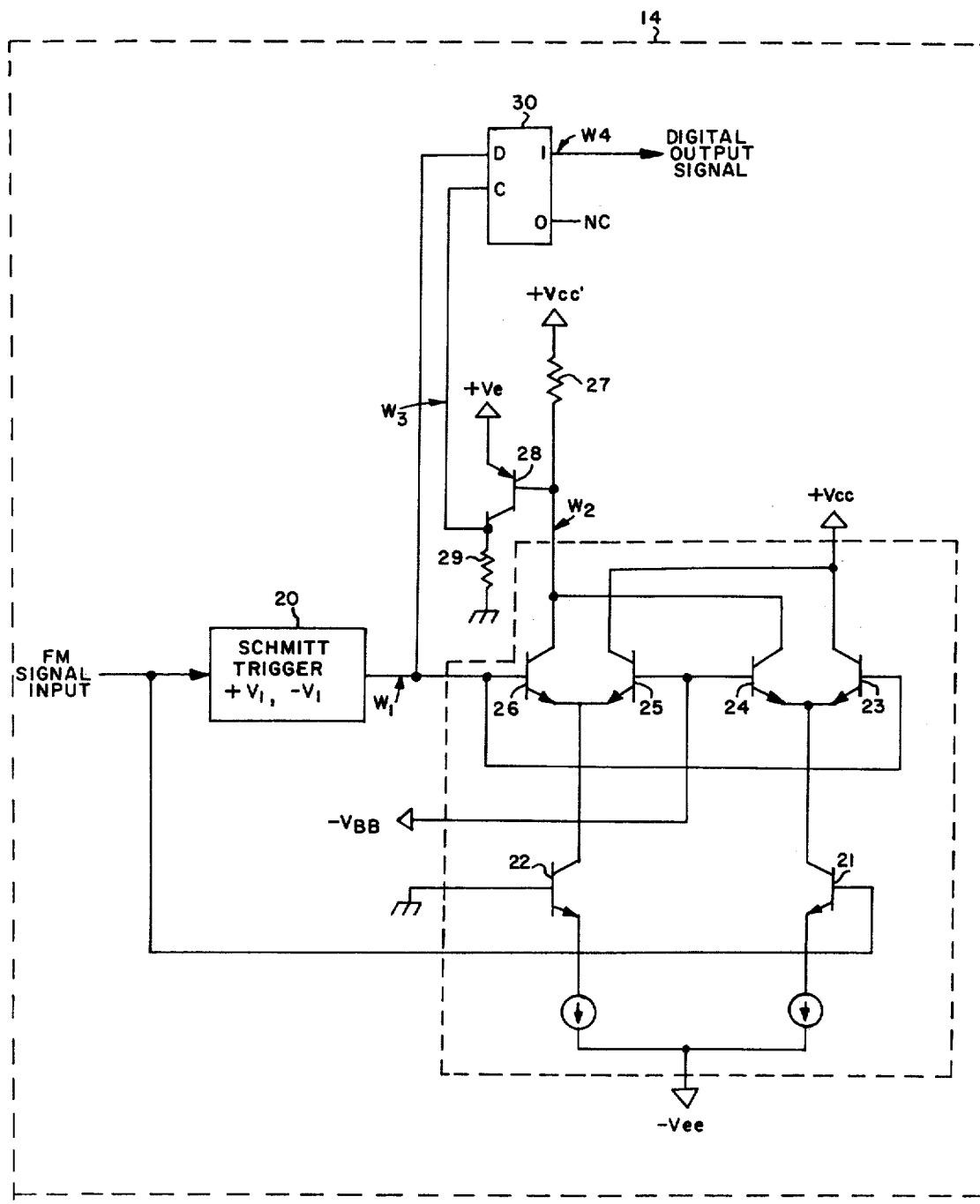
FIG. 3 is a schematic drawing of the waveform squaring circuit shown in FIG. 2.
Figure 5:
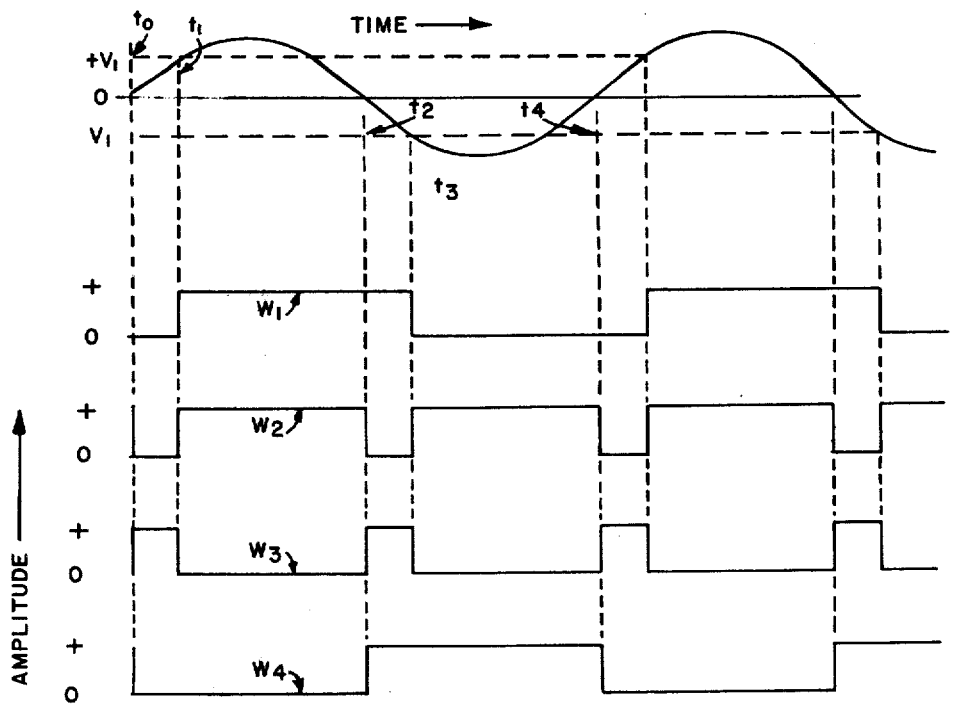
FIG. 5 is a voltage VS time graph for the waveform squaring circuit of FIG. 3.

The operation of the present invention, especially with regard to digitizing the color difference signals $E'_R$ and $E'_B$ subcarrier can best be understood by referring to FIGS. 3 and 5 taken in conjunction with FIG. 2, As shown in FIG. 3, the waveform squaring circuit 14 takes as an input the FM signal corresponding to the color difference signals $D'_R$ or $D'_B$ and produces a digital output signal. The digital output signal W4, shown in FIG. 5, has been obtained from the zero crossings of the input sinusoid.

Figure 4:
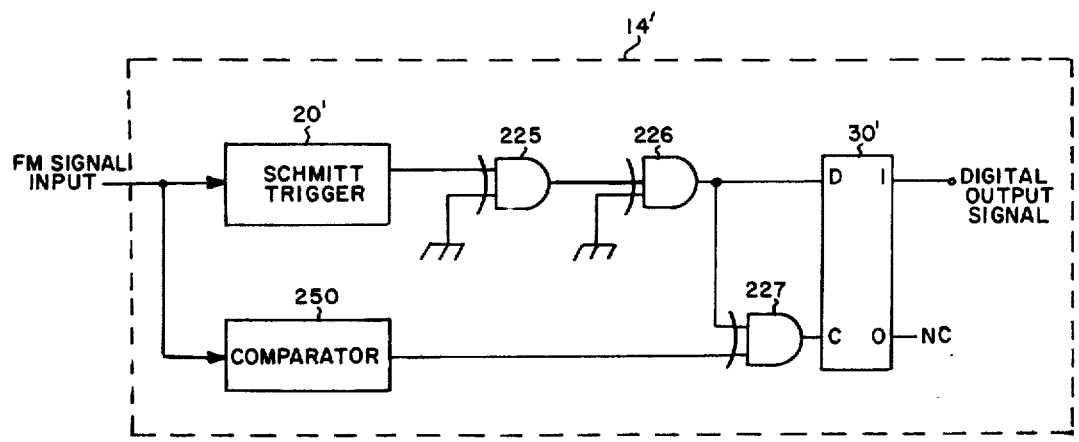
FIG. 4 is a schematic drawing of the improved waveform squaring circuit having improved dynamic range in accordance with the subject invention.

The input FM signal, a sinusoid, is simultaneously applied to a Schmitt trigger stage 20 and the base electrode of transistor 21. As the Schmitt trigger is well-known by those skilled in the art, it will suffice to know that waveform $W_1$ of FIG. 4 is produced provided the trigger points $+V_1$ and $-V_1$ as shown in FIG. 4 are exceeded at its input.

The emitter electrode of transistor 21 is connected to the emitter electrode of transistor 22 and to a source of proper electrical potential $-Vee$ (current sources are indicated by the arrows within the small circles.) The base electrode of transistor 22 is connected to a source of proper electrical potential, ground. The collector electrodes of transistors 21 and 22 are directly connected to transistor pairs 23, 24 and transistor pairs 25, 26 wherein each transistor pair has their emitter electrodes connected together and to said collector electrodes of transistors 21 and 22 respectively. The base electrode of transistor 24 and the base electrode of transistor 25 and the collector electrode of transistor 23 and the collector electrode of transistor 25 are connected together respectively, and are then connected to a source of proper electrical potential $-V_{BB}$ and $+V_{CC}$ respectively. The base electrodes of transistors 23 and 26 are connected together and connected to the output of said Schmitt trigger 20. The collector electrodes of transistors 24 and 26 are connected together and to a source of proper electrical potential $+V_{CC}'$ via a dropping resistor 27. Also, connected directly to the collector electrodes of transistors 24 and 26 is the base electrode of an inverting transistor 28 whose emitter electrode is connected directly to a source of proper electrical potential $+V_e$ and whose collector electrode is connected to a source of proper electrical potential, ground, via a dropping resistor 29. An edge triggered flip-flop 30 has its data input D also connected to the output of the Schmitt trigger 20 and a clock input C connected directly to the collector electrode of transistor 28. The output waveform W4 of the completed circuit is taken at the logic 1 output of said flip-flop 30.

To further understand circuit operation, consider the following circuit conditions exist at a time just prior to time $t_o$. At such time, the input FM signal is assumed to be crossing the zero axis in a positive direction, hence, has reset the Schmitt trigger to produce the waveform W1 when it passed negatively through the trip point $-V_1$. Transistors 21, 23, and 26 are reversed biased; transistors 22, 24, and 25 are forward biased. As a result, a current passes via transistors 22 and 25 from the $+Vcc$ supply to the $-Vee$ supply. The voltage drop across the resistor 27 will be zero so that waveform W3 is at a "high" level. Transistor 28 is reversed biased and no voltage is developed across the resistor 29. The waveform W3 is therefore at a low level. The low level of waveform W3 being applied to the clock input of the flip-flop 30 inhibits change of state of the flip-flop 30 and the waveform W4 at a high level is available at the 1 output of such flip-flop.

At time $t_o$, transistor 21 is forward biased by the input FM signal as such signal crosses the zero axis. As a result, current now passes through transistors 21 and 24 from $+Vcc'$ through resistor 27 to $-Vee$. The voltage drop across the resistor 27 forward biases transistor 28. Current via resistor 29 due to the conduction of transistor 28 produces a voltage drop across such resistor which is applied to the flip-flop 30 clock input. The transition from the "low" level to the high level of waveform W3 transfers the level of waveform w1 to the output, hence waveform W4 is low.

At a next time T1, the Schmitt trigger 20 is tripped by the input FM signal reaching a second trip voltage + $V_1$. Transistors 23 and 26 become forward biased; transistors 24 and 25 are reversed biased. As transistor 22 is now reversed biased, no current is passed through the resistor 27. As a result, transistor 28 is reversed biased to produce the waveform W3. Output waveform W4 therefore remains at the low level. At a next time T2, it becomes obvious that the waveform W4 goes to a high level. As can be discerned from the above discussion, the output waveform W4 changes from the high to low state or vice-versa at each zero crossing of the input FM signal. The zero crossings are thus preserved as is required for proper operation of the dual demodulator which will be covered in detail later in the specification.

It should be noted that transistors 21, 22, 23, 24, and 25 are connected in a manner well-known as a modulator-demodulator circuit and may be of discrete components or an integrated circuit, as shown by the dashed lines, such as a Motorola, Inc. MC 14966 Modulator-Demodulator. Further, the waveform squaring circuits 15, 15', 15'' and 15''' following the delay lines are identical to that shown in FIG. 3 and is incorporated for reasons already discussed.

As is well-known, the trigger points $+V_1$ and $-V_1$ of the Schmitt trigger must be chosen at a sufficiently high level to insure enough delay between the modulator-demodulator transition and the Schmitt trigger transistion to obtain a clock pulse of usuable width. To produce a usuable width clock pulse for the highest level input signal which can be expected, the trip points $\pm V_1$ of the Schmitt trigger must be selected at an amplitude, say 10 percent of the expected input peak value. This sets the lowest level input signal for which the waveform squaring circuit will produce an output. The level selected frequently is not low enough for reasonable fluctuations in input signal level. The embodiment in FIG. 4 overcomes this limitation by allowing selection of the Schmitt trigger levels $\pm V_1$ for the lowest level input and establishing the clock pulse width for the highest level input by a fixed delay.

Figure 6:
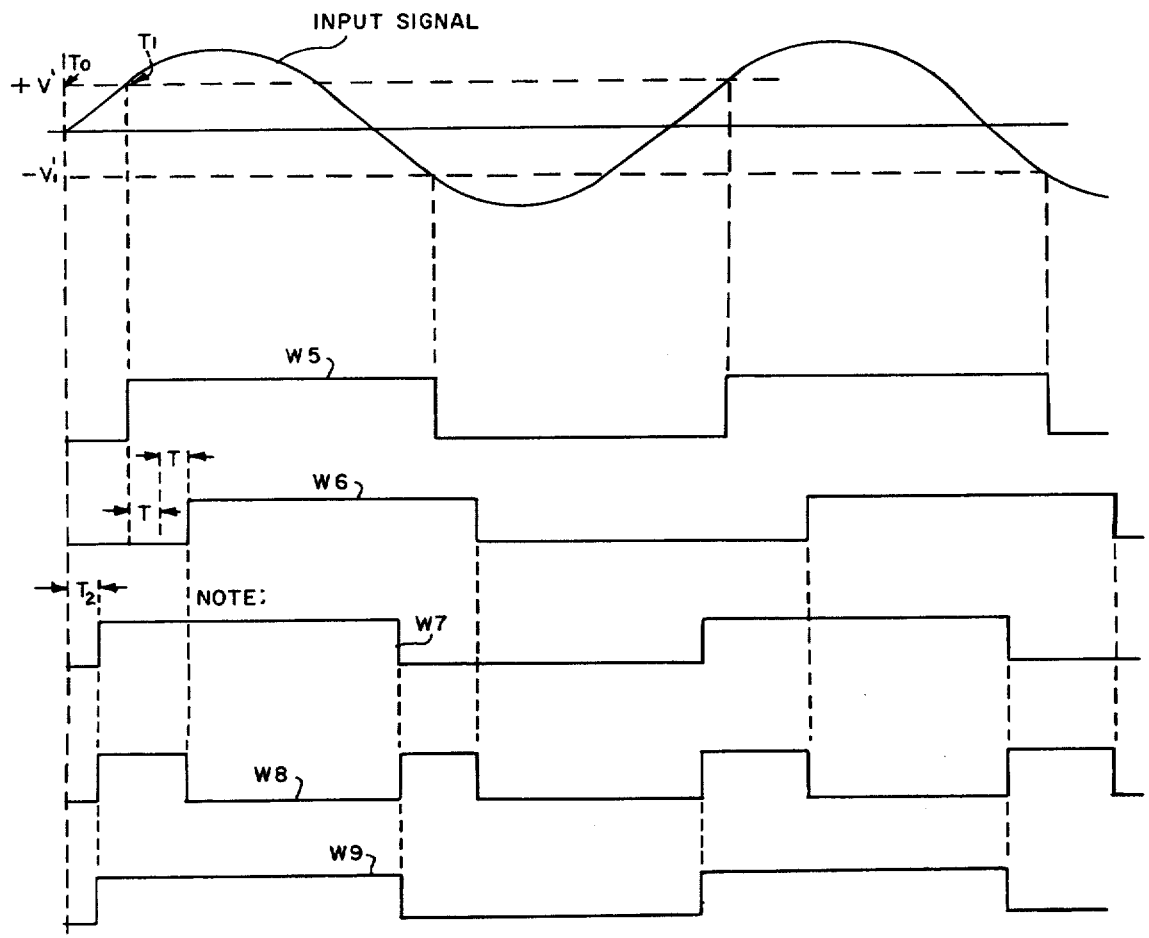
FIG. 6 is a voltage VS time graph for the waveform squaring circuit of FIG. 4.

The operation of the FIG. 4 embodiment, especially with regard to digitizing the color difference signals $D'_R$ and $D'_B$ subcarrier can best be understood by referring to FIG. 6 in conjunction with FIG. 4. As shown, the waveform squaring circuit 14' takes as an input the FM signal corresponding to the color difference signals $D'_R$ and $D'_B$ and produces a digital output signal. The digital output signal W9, shown in FIG. 6, has been obtained from the zero crossings of the input sinusoid.

The input FM signal, a sinusoid, is simultaneously applied to a Schmitt trigger stage 20' and the input to a comparator stage 250. Again, as the Schmitt trigger is well-known by those skilled in the art, it will surfice to know that the waveform W5 of FIG. 6 is produced provided the trigger points $\pm V_1'$ as shown are exceeded at its input. The output of the Schmitt trigger, waveform W5, is applied to the data input D of an edge triggered flip-flop 30' via a plurality of series connected delay means 225 and 226, such for example, as a conventional "exclusive OR gate". Such logic is well-known and will not be described in detail. The data input to edge triggered flip-flop 30' is therefore the waveform W6, delayed by T, hereinafter referred to as tau, dependent upon the number of delay means used.

In the embodiment of FIG. 4 the delay between the waveforms W5 and W6 defines 2 times tau. Similarly, the output of the comparator 250 is the waveform W7 including comparator delay $T_2$ and is used to generate the waveform W8 applied to clock input C of edge triggered flip-flop 30' via the gate 227, also shown as an exclusive OR gate. Gate 227 is also driven by the waveform W6.

The comparator 250 (comparator 250 can be a conventional comparator such as the Signetics NE529) retains the zero crossing of the input signal because of its extremely high gain and the Schmitt trigger determines if the input signal is of sufficient amplitude to be a valid input. Thus, if the input signal is above the amplitude of the upper and lower trip points of the Schmitt trigger 20', the Schmitt trigger output will follow the zero crossings of the incoming signal but will have its transitions delayed an amount which depends upon the input signal amplitude. For very high amplitude inputs, the Schmitt trigger transitions will occur practically simultaneously with the comparator transitions with an ensured minimum time delay between the output transitions of the Schmitt trigger and the output of the comparator as shown in FIG. 6 due to the delay means.

Because the clock pulse width to edge triggered flip-flop 30' are determined by the difference in time between the input signal zero crossings and the Schmitt trigger transition, a minimum pulse width independent of input signal amplitude sufficient to clock the data input D of the edge triggered flip-flop 30' is assured. The leading edge of the waveform W8, generated by exclusively oring the waveforms W6 and W7, transfers the data to the output of the waveform squaring circuit and as discerned from waveform W9, follows the input signal zero crossings with slight delay which is caused by the delay of the comparator 250. If, however, the input signal falls below the level of the upper or lower trip points of the Schmitt trigger, the data input to the edge triggered flip-flop 30' will not change. This then provides a clear indication as to whether the FM subcarrier is not present, or is too low a level.

The improved circuit will therefore operate with very high level input signals and low level input signals selected independently which is the essence of the improvement over the previous embodiment. It should be pointed out however, that the amount of delay which is added directly limits the frequency range over which the circuit retains the full dynamic range which is selected. As an example, the maximum clock pulse width of the embodiment using two delay means would be $$W = \pi/2 \text{ radians} + 2\ T_1 - T_2$$

at the lowest frequency and level which would produce an output. This imposes the limitation that $$2\ T_1 - T_2 < \pi/2 \text{ radians}$$

at the highest frequency and level which will produce an output. Thus, with two exclusive OR gate delay means and the comparator having typical delay times of 15 ns and 10ns respectively, the maximum input frequency would be approximately equal to 12 MHz as mathematically found by $$2\ (15\text{ns}) - 10\text{ns} \leq 1/4f$$

or $$f \leq (1/80\text{ ms}) = 12 \text{ MHz}.$$

The invention is claimed in accordance with the following:

1. An analog limiter with input level sensing and TTL level output, comprising:

Schmitt trigger means responsive to the amplitude of an analog signal applied thereto for providing a first square wave;

comparator means responsive to the zero crossings of an analog signal applied thereto for providing a second square wave;

means responsive to said first and second square waves for providing a data signal and a timing signal; and means responsive to both said data and timing signals for providing an output square wave having the zero crossings of said analog signal.

2. The method of deriving a digital output signal in response to an analog input signal where the output signal maintains the zero crossings of the analog input comprising the steps of:

applying the analog input signal to a means responsive to the amplitude of the analog input signal;

applying the analog input signal to a means responsive to the zero crossings of the analog input signal;

generating a first output square wave defining a data signal in response to the amplitude of the analog input signal;

generating a second output square wave in response to the zero crossings of the analog input signal;

applying said first and second output square waves to a means responsive to both said first and second output square waves;

generating a clock signal in response to the anticoincidence of both said first and second output square waves;

applying both said data and clock signals to a means responsive to said data signal and said clock signal; and generating the digital output signal in response to said data signal and said clock signal.

* * * * *

UNITED STATES PATENT OFFICE
CERTIFICATE OF CORRECTION

PATENT NO. : 3,939,432
DATED : February 17, 1976
INVENTOR(S) : LARRY ALLAN NELSON It is certified that error appears in the above-identified patent and that said Letters Patent are hereby corrected as shown below:

Column 1, Line 51, "undiviated" should be --undeviated--
Column 2, Line 40, "transistion" should be --transition--
Column 4, Line 16, "limited" should be --limiter--
Column 4, Line 21, "occuring" should be --occurring--
Column 5, Line 62 "FIG. 2," should be --FIG. 2.--
Column 7, Line 1, "wl" should be --W1--
Column 7, Line 31, "transistion" should be --transition--
Column 7, Line 57, "surfice" should be --suffice--
Column 8, Line 60, "`15 ns" should be --15 ns--
Column 8, Line 65 (paragraph omitted):
"While there has been shown and described the preferred embodiments of the present invention, it will be apparent to those skilled in the art that many changes and modifications may be made without departing therefrom in its broader aspects. Therefore, the appended claims are intended to cover all such changes and modifications as fall within the true spirit and scope of the invention."

Signed and Sealed this twenty-fifth Day of May 1976

[SEAL]

Attest:

RUTH C. MASON
Attesting Officer

C. MARSHALL DANN
Commissioner of Patents and Trademarks